(12) United States Patent
Sakurada

(10) Patent No.: US 7,335,604 B2
(45) Date of Patent: Feb. 26, 2008

(54) THIN-FILM COATING APPARATUS

(75) Inventor: Kazuaki Sakurada, Shimosuwa-machi (JP)

(73) Assignee: Seiko Epson Corporation, Tokyo (JP)

( * ) Notice: Subject to any disclaimer, the term of this patent is extended or adjusted under 35 U.S.C. 154(b) by 24 days.

(21) Appl. No.: 10/365,537

(22) Filed: Feb. 13, 2003

(65) Prior Publication Data

US 2003/0159651 A1 Aug. 28, 2003

(30) Foreign Application Priority Data

Feb. 22, 2002 (JP) ............................. 2002-046294

(51) Int. Cl.
*H01L 21/469* (2006.01)
*H01L 21/31* (2006.01)

(52) U.S. Cl. .................. 438/758; 118/620; 118/676; 438/778; 438/780; 430/311

(58) Field of Classification Search ................ 118/300, 118/303, 313, 323, 663, 679–686, 620, 676; 438/114, 476, 496, 584–688, 758–794; 430/311
See application file for complete search history.

(56) References Cited

U.S. PATENT DOCUMENTS

| | | | |
|---|---|---|---|
| 5,976,256 A | 11/1999 | Kawano | |
| 6,197,385 B1 * | 3/2001 | Takeshita et al. | 427/425 |
| 6,239,044 B1 * | 5/2001 | Kashiwagi et al. | 438/787 |
| 6,635,113 B2 | 10/2003 | Takamori et al. | |
| 6,676,757 B2 * | 1/2004 | Kitano et al. | 118/676 |
| 6,695,922 B2 * | 2/2004 | Kitano et al. | 118/667 |
| 2001/0033895 A1 | 10/2001 | Minami et al. | |

FOREIGN PATENT DOCUMENTS

| | | |
|---|---|---|
| CN | 1127696 A | 7/1996 |
| JP | A-62-14067 | 6/1987 |
| JP | A-63-069564 | 3/1988 |
| JP | A 01-161218 | 6/1989 |
| JP | A-03-214722 | 9/1991 |
| JP | A-07-080384 | 3/1995 |
| JP | A 08-299878 | 11/1996 |
| JP | A-11-329938 | 11/1999 |
| KR | 1998-042825 | 8/1998 |
| KR | 2001-0098805 | 11/2001 |

* cited by examiner

*Primary Examiner*—M. Wilczewski
*Assistant Examiner*—Khanh Duong
(74) *Attorney, Agent, or Firm*—Oliff & Berridge, PLC

(57) ABSTRACT

To provide a thin-film forming device and a thin-film forming method, a liquid crystal display and a device and method for manufacturing the same, and a thin-film structure and a device and method for manufacturing the same, in which material losses are reduced by using a droplet ejection head, and in addition, the thickness of the entire film can be made uniform. The invention can include a thin-film forming device that is a device for forming a thin film by applying a coating solution onto a substrate, the coating solution containing a solvent and a film-forming material dissolved or dispersed therein. Also an ejection mechanism having a droplet ejection head for ejecting the coating solution onto the substrate, a moving mechanism capable of relatively moving the positions of the droplet ejection head and the substrate, and a control unit for controlling at least one of the ejection mechanism and the moving mechanism can be provided for the thin-film forming device. In addition, a solvent vapor supply mechanism for supplying the solvent vapor to the vicinity of the coating solution applied onto the substrate can also be provided for the thin-film forming device.

6 Claims, 7 Drawing Sheets

(a)

(b)

(a)

(b)

(c)

THIN-FILM COATING APPARATUS

BACKGROUND OF THE INVENTION

1. Field of Invention

The present invention relates to devices and methods for forming thin films by applying a coating solution containing a film-forming material dissolved or dispersed in a solvent onto a substrate, to liquid crystal displays and devices and methods for manufacturing the same by using the devices and methods described above, to thin film structures and devices and methods for manufacturing the same, and to electronic apparatuses. In more particular, the present invention relates to a device and a method capable of forming a thin film having a uniform thickness.

2. Description of Related Art

Currently, as techniques for forming thin films, for example, a spin coating method, which is one of thin-film coating methods, has been generally used. This spin coating method is a method for forming a thin film by dripping a coating solution onto a substrate and subsequently applying the coating solution over the entire substrate using a centrifugal force generated by rotating the substrate. In this coating method, the film thickness is controlled, for example, by a rotation speed and rotation time, or viscosity of the coating solution. This spin coating method has been widely used, for example, for the formation of photoresist films or interlayer insulating films such as SOG (spin on glass) in a semiconductor manufacturing process or the like; the formation of overcoating films (planarization films) or alignment films in a process for manufacturing liquid crystal displays or the like. Further the method has been used in the formation of protection films in a process for manufacturing optical discs or the like.

However, in this spin coating method, since most of the coating solution thus supplied is scattered, a large quantity of the coating solution must be supplied, and at the same time, the waste thereof is large, resulting in disadvantageous increase in cost. In addition, since the substrate is rotated, the coating solution flows from the inside to the outside due to a centrifugal force, and as a result, the thickness at the peripheral region tends to be thick as compared to that at the inside region, resulting in problem of uneven film thickness. As measures against the disadvantages described above, in recent years, a technique using a so-called inkjet method has been proposed.

For example, in Japanese Unexamined Patent Application Publication No. 8-250389, a technique has been disclosed in which a coating solution is applied onto a substrate using an inkjet method to form a thin film. In this technique, a head is relatively and linearly moved with respect to the substrate by a relative moving device so that the coating solution is applied uniformly onto a rectangular substrate.

SUMMARY OF THE INVENTION

However, according to the conventional technique described above, a problem has been encountered in that the thickness uniformity of the thin-film thus formed cannot be satisfactory. In other words, in general, in a coating solution to be applied using a droplet ejecting head, a film-forming material, which is a solid component, is dissolved or dispersed in a solvent so as to have fluidity, and hence the coating solution thus formed can be supplied to a nozzle and can be ejected therefrom. Accordingly, as shown in FIG. 8($a$), when a coating solution containing a solvent as described above is applied onto a substrate 1 to form a thin film, in a film 2 composed of the coating solution right after the application, a contractive force toward the inside as shown by the arrow A in FIG. 8($a$) is generated at a peripheral portion (edge portion) 2$a$ by a surface tension.

In addition to the force described above, in the vicinity of the surface of the film 2, the concentration of a solvent vapor evaporated from the film 2 is high over a central portion 2$b$ of the film 2 and is low over the peripheral portion 2$a$ because of the diffusion of the solvent vapor. Hence, the evaporation of the solvent is unlikely to occur at the central portion 2$b$ at which the concentration of the solvent vapor is high in the vicinity of the surface of the film 2, and the evaporation is likely to occur at the peripheral portion 2$a$ at which the concentration of the solvent vapor is low. Therefore, as shown by the arrow B in FIG. 8($b$), the convection of the solvent in the film 2 occurs from the central portion 2$b$ side to the peripheral portion 2$a$ side.

As a result, since the coating solution (film 2) is pulled inside from an impact point of a droplet ejected from the nozzle as shown in FIG. 8($b$), a solute or a dispersed material is moved to the peripheral portion by the convection of the solvent, and hence the film thickness becomes large. When the thickness of the peripheral portion 2$a$ becomes large as compared to that of the central portion, the thickness uniformity of the entire film 2 obtained after curing is of course degraded. Hence, when this film 2 is used for a film in a liquid crystal display, such as an alignment film or an overcoating film formed on a color filter, alignment irregularity of liquid crystal or color irregularity may be observed particularly at the peripheral portion 2$a$ in some cases.

The present invention was made in consideration of the problems described above, and an object of the present invention is to provide a device and methods for forming a thin film, which are capable of reducing the waste of a material by using a droplet ejection head and of forming a uniform thickness over the entire film. Further, the invention provides a liquid crystal display and a device and method for manufacturing the same by using the device and method described above, a thin-film structure and a device and method for manufacturing the same, and an electronic apparatus.

To these ends, a thin-film forming device of the present invention is a device for forming a thin film by applying a coating solution containing a film-forming material dissolved or dispersed in a solvent onto a substrate. The thin-film forming device described above can include an ejection mechanism having a droplet ejection head for ejecting the coating solution onto the substrate, a moving mechanism capable of relatively moving the positions of the droplet ejection head and the substrate, a control unit for controlling at least one of the ejection mechanism and the moving mechanism, and a solvent vapor supply mechanism for supplying a solvent vapor to the vicinity of the coating solution applied onto the substrate.

According to this thin-film forming device described above, since the solvent vapor supply mechanism is provided therefor, when the solvent vapor is supplied thereby to the vicinity of the coating solution applied onto the substrate, the difference in concentration of the solvent vapor between over the central portion of a coating film made of the coating solution and over the peripheral portion thereof can be decreased. Accordingly, degradation of thickness uniformity of the entire film to be obtained, in which the thickness at the peripheral portion becomes larger than that at the central portion because of the difference in concentration of the solvent vapor, can be avoided.

In addition, in this thin-film forming device described above, the solvent vapor supply mechanism preferably supplies the solvent vapor so that the concentration thereof thus supplied is high at the peripheral portion of the coating solution applied onto the substrate as compared to that at the central portion thereof.

When the structure is formed as described above, the difference in concentration of the solvent vapor between over the central portion of the coating film formed of the coating solution and over the peripheral portion thereof can be further decreased, and hence the thickness uniformity of the entire film thus formed can be further improved.

In addition, in this thin-film forming device described above, the solvent vapor supply mechanism preferably includes a cover for covering at least the front surface side of the substrate and supply means for supplying the solvent vapor inside this cover.

According to the structure described above, while the vicinity of the surface of the substrate is covered with the cover, for example, by supplying a solvent vapor at a sufficiently high concentration inside the cover, the difference in concentration of the solvent vapor between over the central portion of the coating solution applied onto the substrate and over the peripheral portion can be decreased so that the difference described above can be substantially ignored. As a result, the entire thickness of the film thus formed can be made uniform.

In addition, in this thin-film forming device, the control unit preferably changes the coating conditions by controlling at least one of an ejection operation by the ejection mechanism and a moving operation by the moving mechanism so as to control the thickness of the thin film.

According to the structure described above, since at least one of the ejection operation by the ejection mechanism and the moving operation by the moving mechanism is controlled by the control unit, and the film thickness of the thin film is controlled by changing the coating conditions, the film thickness control of the thin film can be easily and highly accurately performed, and in addition, miniaturization of the device and the cost reduction can be achieved.

A thin-film forming method of the present invention is a method for forming a thin film by applying a coating solution containing a film-forming material dissolved or dispersed in a solvent onto a substrate by the thin-film forming device described above. The method described above can include the steps of ejecting the coating solution from the droplet ejection head onto the substrate, and subsequently supplying a solvent vapor from the solvent vapor supply mechanism to the vicinity of the coating solution thus ejected.

According to this thin-film forming method, since the solvent vapor is supplied by the solvent vapor supply mechanism of the thin-film forming device described above to the vicinity of the coating solution applied onto the substrate, the difference in concentration of the solvent vapor between over the central portion of a coating film made of the coating solution and over the peripheral portion thereof can be decreased. Hence, degradation of thickness uniformity over the entire film to be obtained, in which the thickness at the peripheral portion becomes larger than that at the central portion because of the difference in concentration of the solvent vapor, can be avoided.

A device for manufacturing a liquid crystal display, according to the present invention, is an device for manufacturing a liquid crystal display having a pair of substrates and liquid crystal held therebetween. The device described above comprises the thin-film forming device described above, wherein the thin-film forming device forms at least one type of thin film on the substrates.

In addition, a method for manufacturing a liquid crystal display, according to the present invention, is a method for manufacturing a liquid crystal display having a pair of substrates and liquid crystal held therebetween. The method described above comprises forming at least one type of thin film on the substrate by the thin-film forming method described above.

According to the device and method described above for manufacturing the liquid crystal display, by supplying the solvent vapor using the solvent vapor supply mechanism of the thin-film forming device described above to the vicinity of the coating solution applied onto the substrate, the difference in concentration of the solvent vapor between over the central portion of a coating film made of the coating solution and over the peripheral portion thereof can be decreased. Hence, the thickness uniformity over the coating film made of the coating solution can be improved, and as a result, inconveniences such as alignment irregularity of liquid crystal or color irregularity can be avoided.

A liquid crystal display of the present invention is manufactured by the method described above for manufacturing the liquid crystal display.

According to this liquid crystal display, the thickness uniformity of the thin film can be improved since the difference in concentration of the solvent vapor between over the central portion of the coating film and over the peripheral portion thereof is decreased as described above, and hence inconveniences such as alignment irregularity of liquid crystal or color irregularity can be avoided.

A device for manufacturing a thin-film structure, according to the present invention, is a device for manufacturing a thin-film structure in which a thin film is formed on a substrate. The device described above comprises the thin-film forming device described above, wherein the thin-film forming device forms at least one type of thin film on the substrate.

In addition, a method for manufacturing a thin-film structure, according to the present invention, is a method for manufacturing a thin-film structure in which a thin film is formed on a substrate. The method described above comprises forming at least one type of thin film on the substrate by the thin-film forming method described above.

According to the device and method described above for manufacturing the thin-film structure, by supplying the solvent vapor using the solvent vapor supply mechanism of the thin-film forming device described above to the vicinity of the coating solution applied onto the substrate, the difference in concentration of the solvent vapor between over the central portion of a coating film made of the coating solution and over the peripheral portion thereof can be decreased. Hence, the thickness uniformity of the coating film made of the coating solution can be improved.

A thin-film structure of the present invention is manufactured by the above method for manufacturing the thin-film structure. According to this thin-film structure, since the difference in concentration of the solvent vapor between over the central portion of the coating film and over the peripheral portion thereof is decreased as described above, the thickness uniformity of the thin film thus formed can be improved.

An electronic apparatus of the present invention can include the liquid crystal display or the thin-film structure described above as a display device.

According to the electronic apparatus described above, since the liquid crystal display in which inconvenience such as alignment irregularity of liquid crystal or color irregularity is avoided is used as display means, superior display can be performed.

BRIEF DESCRIPTION OF THE DRAWINGS

The invention will be described with reference to the accompanying drawings wherein like numerals reference like elements, and wherein.

DETAILED DESCRIPTION OF PREFERRED EMBODIMENTS

Figure 1:
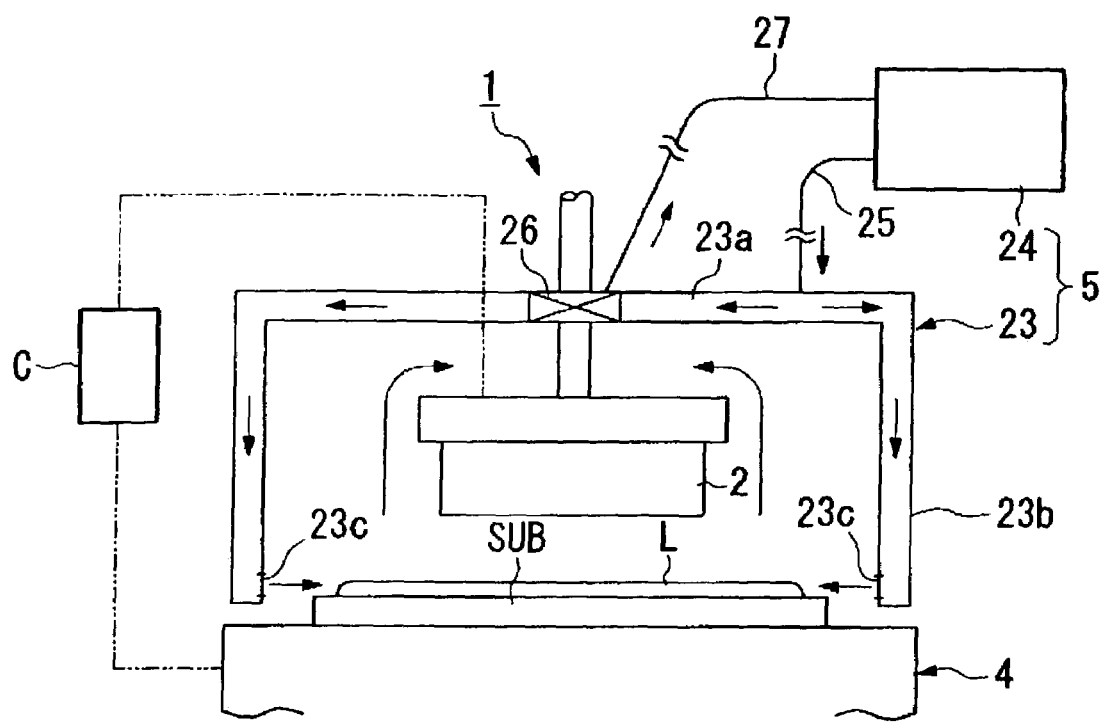
FIG. 1 is a side view for illustrating the schematic structure of one example of a thin-film forming device of the present invention.

FIG. 1 is a view showing one embodiment of a thin-film forming device of the present invention, and reference numeral 1 in FIG. 1 indicates the thin-film forming device. This thin-film forming device 1 is used for forming thin films formed on a substrate of a liquid crystal display device (liquid crystal display) and, particularly in this embodiment, is used for applying a coating solution L on a substrate SUB provided with color filters to form a thin film functioning as an overcoating film (planarization film).

This thin-film forming device 1 has the structure including an ejection mechanism 3 having a droplet ejecting head 2 for ejecting the coating solution L onto the substrate SUB, a moving mechanism 4 for relatively moving the positions of the droplet ejecting head 2 and the substrate SUB, a control unit C for controlling the ejection mechanism 3 and the moving mechanism 4, and in addition, a solvent vapor supply mechanism 5 for supplying a solvent vapor to the vicinity of the coating solution L applied onto the substrate SUB.

The moving mechanism 4 can include a head supporter 7 for supporting the droplet ejecting head 2 at a position over the substrate SUB provided on a substrate stage 6 so that the head 2 faces downward, and a stage driver 8 for moving the substrate SUB together with the substrate stage 6 in an X and a Y direction with respect to the droplet ejecting head 2 located above.

The head supporter 7 can include a mechanism, such as a linear motor, capable of moving at an optional moving speed and positioning the droplet ejection head 2 in the vertical direction (Z axis) with respect to the substrate SUB and a mechanism such as a stepping motor capable of setting the droplet ejecting head 2 at an optional angle with respect to the substrate SUB provided at the lower side by rotating the droplet ejecting head 2 about a vertical central axis.

The stage driver 8 can include a θ axis stage 9 capable of setting the substrate stage 6 at an optional angle with respect to the droplet ejection head 2 by rotating the substrate stage 6 about the vertical central axis, and stages 10a and 10b for moving the substrate stage 6 in the horizontal directions (X direction and Y direction) with respect to the droplet ejection head 2 and positioning the substrate stage 6. In addition, the θ axis stage 9 is formed of a stepping motor or the like, and the stages 10a and 10b are each formed of a linear motor or the like.

The ejection mechanism 3 can have the droplet ejection head 2 and a tank T connected thereto through a tube 11. The tank T stores the coating solution L and is formed to supply this coating solution L to the droplet ejection head 2 through the tube 11. According to the structure described above, the ejection mechanism 3 is formed to eject the coating solution L stored in the tank T so as to apply the coating solution L onto the substrate SUB.

The droplet ejection head 2 can be a head for ejecting a liquid (liquid material) by a pressure generated by compressing a room in which the liquid is contained using a piezoelectric element or the like and is provided with a plurality of nozzles (nozzle holes) aligned in at least one line.

Figure 3:
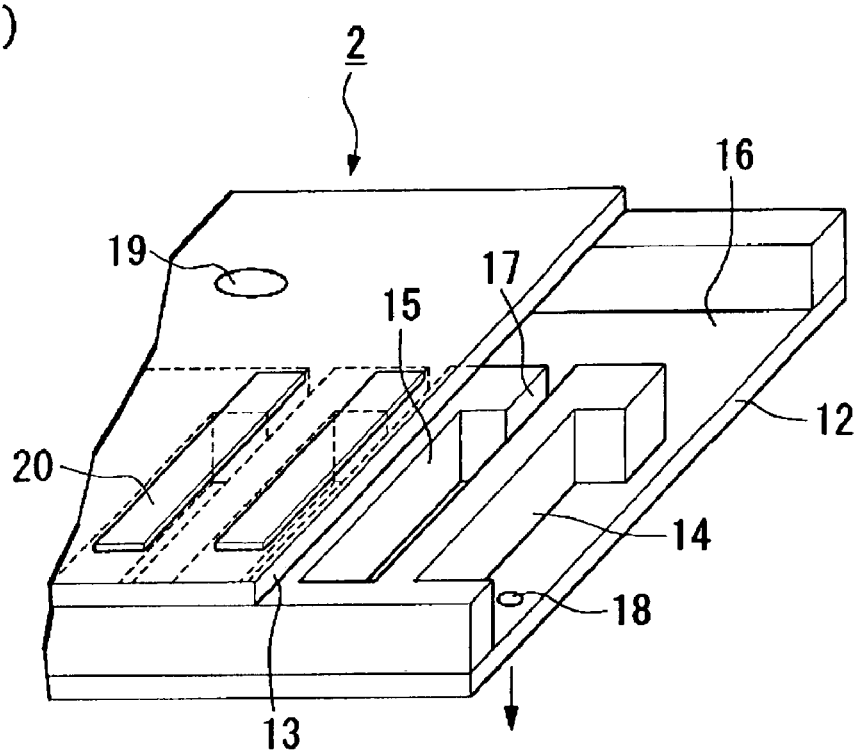
FIG. 3 includes views for illustrating the schematic structure of a droplet ejection head, (a) is a perspective view of an important portion, and (b) is a side cross-sectional view of an important portion.
Figure 3:
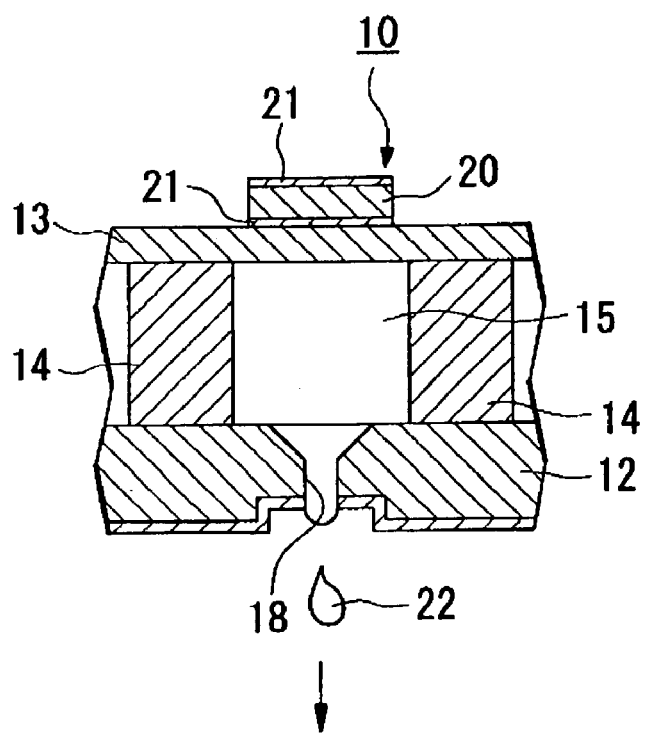

One example of the structure of this droplet ejection head 2 will be described. As shown in FIG. 3(a), the droplet ejection head 2 can include a nozzle plate 12 composed, for example, of a stainless steel and a vibration plate 13 bonded thereto with a partition member (reserver plate) 14 provided therebetween. Between the nozzle plate 12 and the vibration plate 13, a plurality of spaces 15 and a liquid pool 16 are formed by the reserver plate 14. These spaces 15 are communicated with the liquid pool 16 via respective supply inlets 17. In addition, the nozzle plate 12 is provided with nozzles 18 for ejecting a liquid material from the respective spaces 15. In the vibration plate 13, an opening 19 is formed for supplying the liquid material into the liquid pool 16.

In addition, as shown in FIG. 3(b), a piezoelectric element 20 is bonded to the opposite surface of the vibration plate 13 from that facing the spaces 15. This piezoelectric element 20 is located between a pair of electrodes 21 and is warped so as to project outside when electricity is applied thereto. According to the structure described above, the vibration plate 13 bonded to the piezoelectric element 20 is simultaneously warped outside therewith, and as a result, the volume of the space 15 is increased thereby. Consequently, the liquid material corresponding to the volume increased in the space 15 is supplied thereto from the liquid pool 16 through the supply inlet 17. In addition, when the application of the electricity to the piezoelectric element 20 above is stopped, the piezoelectric element 20 and the vibration plate 13 each return to the original shape. Hence, the volume of the space 15 also returns to the original one, a pressure of the liquid material inside the space 15 is increased, thereby ejecting a droplet 22 of the liquid material to a substrate from the nozzle 18.

As a system for the droplet ejection head 2, in addition to a piezoelectric jet system using the piezoelectric element 20 described above, for example, a system including an electrothermal converter as an energy generation element may also be used.

Figure 2:
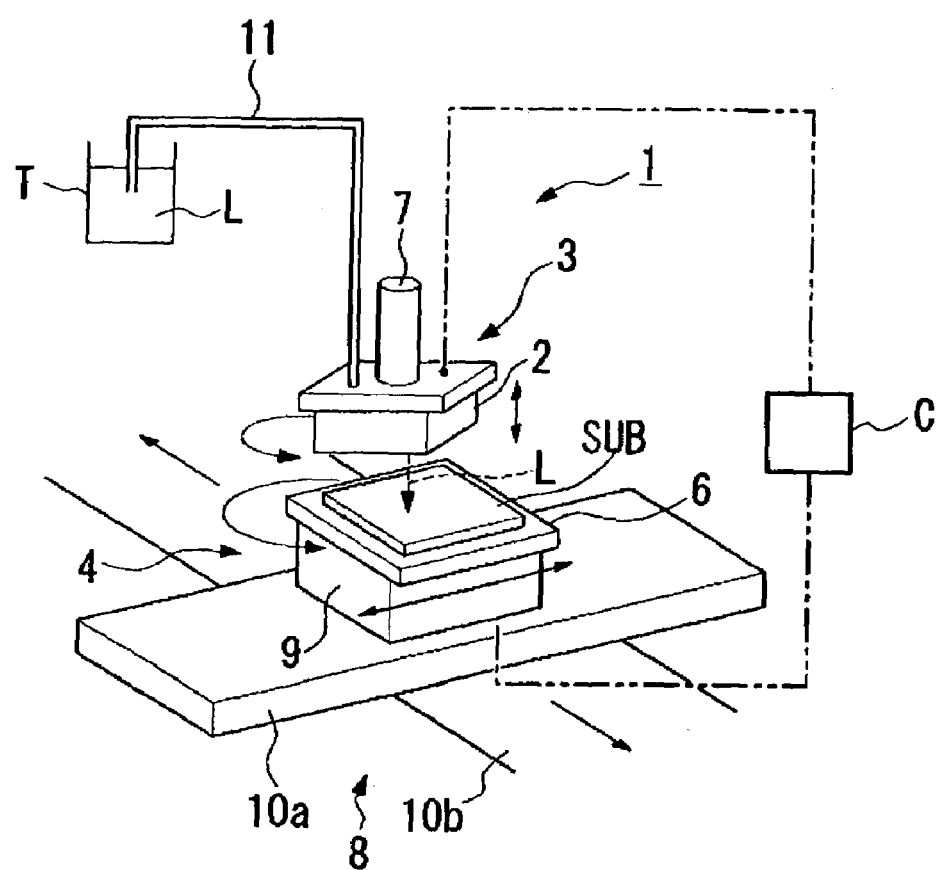
FIG. 2 is a perspective view for illustrating an important portion of the schematic structure of the thin-film forming device shown in FIG. 1.

The control unit C can be composed, for example, of a computer, which contains a CPU such as a microprocessor for controlling the entire device and has input/output functions for various signals, and is electrically connected to the ejection mechanism 3 and the moving mechanism 4 as shown in FIGS. 1 and 2. Hence, at least one of an ejection operation by the ejection mechanism 3 and a moving operation by the moving mechanism 4 is controlled by the control unit C, and in this embodiment, both operations are controlled thereby. According to this structure, the control unit C has functions of controlling the film thickness of a thin film (overcoating film) to be formed by changing the coating conditions of the coating solution L.

In other words, as the functions of controlling the film thickness described above, the control unit C has a control function of changing ejection spatial intervals of the coating solution L onto the substrate SUB, a control function of changing an ejection amount of the coating solution L per dot, a control function of changing an angle θ formed by the alignment direction of the nozzles 18 and the moving direction by the moving mechanism 4, a control function of setting the coating conditions for each of coating steps when coating is repeatedly performed on the same position of the substrate SUB, and a control function of setting the coating conditions for each of a plurality of regions of the substrate SUB.

Furthermore, as the control function of changing the ejection spatial intervals described above, the control unit C has a control function of changing the ejection spatial intervals by changing a relative moving speed between the substrate SUB and the droplet ejection head 2, a control function of changing the ejection spatial intervals by changing ejection time intervals while moving, and a control function of changing the ejection spatial intervals by optionally assigning some nozzles among the plurality of nozzles to simultaneously eject the coating solution L.

The solvent vapor supply mechanism 5 can be composed of a cover 23 for covering at least the front surface side of the substrate stage 6 and the substrate SUB held thereby and a supply device (supply means) 24 for supplying the solvent vapor inside this cover 23 as shown in FIG. 1. In particular in this embodiment, the structure is formed in which the solvent vapor is supplied so that the concentration thereof is high at the peripheral portion of the coating solution L applied onto the substrate SUB as compared to that at the central portion.

The cover 23 has a rectangular box shape provided with an opening at the bottom side and can be moved up and down by a lift device not shown in the figure. As described later, the bottom end portion of this cover 23 is to be located in the vicinity of the surface of the substrate stage 6 as shown in FIG. 1 while the supply device 24 is operated. In addition, this entire cover 23 has a double-wall structure so that the inside of the wall functions as a passage for the vapor to flow. That is, a flexible pipe 25 extending from the supply device 24 is connected to a top plate 23a of this cover 23, and at the inside wall side of the bottom end portion of a side wall 23b, supply openings 23c for supplying the solvent vapor are provided. At the central portion of the top plate 23a of the cover 23, a suction fan 26 is provided, and a flexible pipe 27 is connected to this suction fan 26. This flexible pipe 27 is connected to the supply device 24 described above.

In particular, the supply device 24 serves to generate and supply a vapor of the solvent used for the coating solution L ejected from the droplet ejection head 2 and is composed of a container (not shown) for storing the solvent, heating means such as a heater for heating the solvent in the container, and an air-supply pump (not shown) for supplying the solvent vapor generated by heating to the inside of the cover 23 through the flexible pipe 25.

The solvent vapor supply mechanism 5 having the structure described above supplies the solvent vapor thus generated inside the double-wall of the cover 23 through the flexible pipe 25 so as to be ejected from the supply openings 23c, thereby supplying the solvent vapor to the vicinity of the surface of the substrate SUB covered with the cover 23. In addition, the solvent vapor in the vicinity of the substrate SUB covered with the cover 23 is returned again to the supply device 24 through the suction fan 26. In this structure, since the cover 23 is provided with the supply openings 23c at the bottom end portion of the sidewall 23b for supplying the solvent vapor, the solvent vapor is to be supplied to the peripheral portion of the coating solution L applied onto the substrate SUB. According to the structure described above, in the vicinity of the substrate SUB, the concentration of the solvent vapor becomes high at the peripheral portion as compared to that at the central portion.

Next, a liquid crystal display having an overcoating film formed by the thin-film forming device of the present invention and a method for forming this overcoating film (planarization film) will be described. In this embodiment, the schematic structure of the liquid crystal display and the steps of forming the overcoating film are only described, and descriptions of steps, other than those mentioned above, of forming the entire liquid crystal display are omitted.

Figure 4:
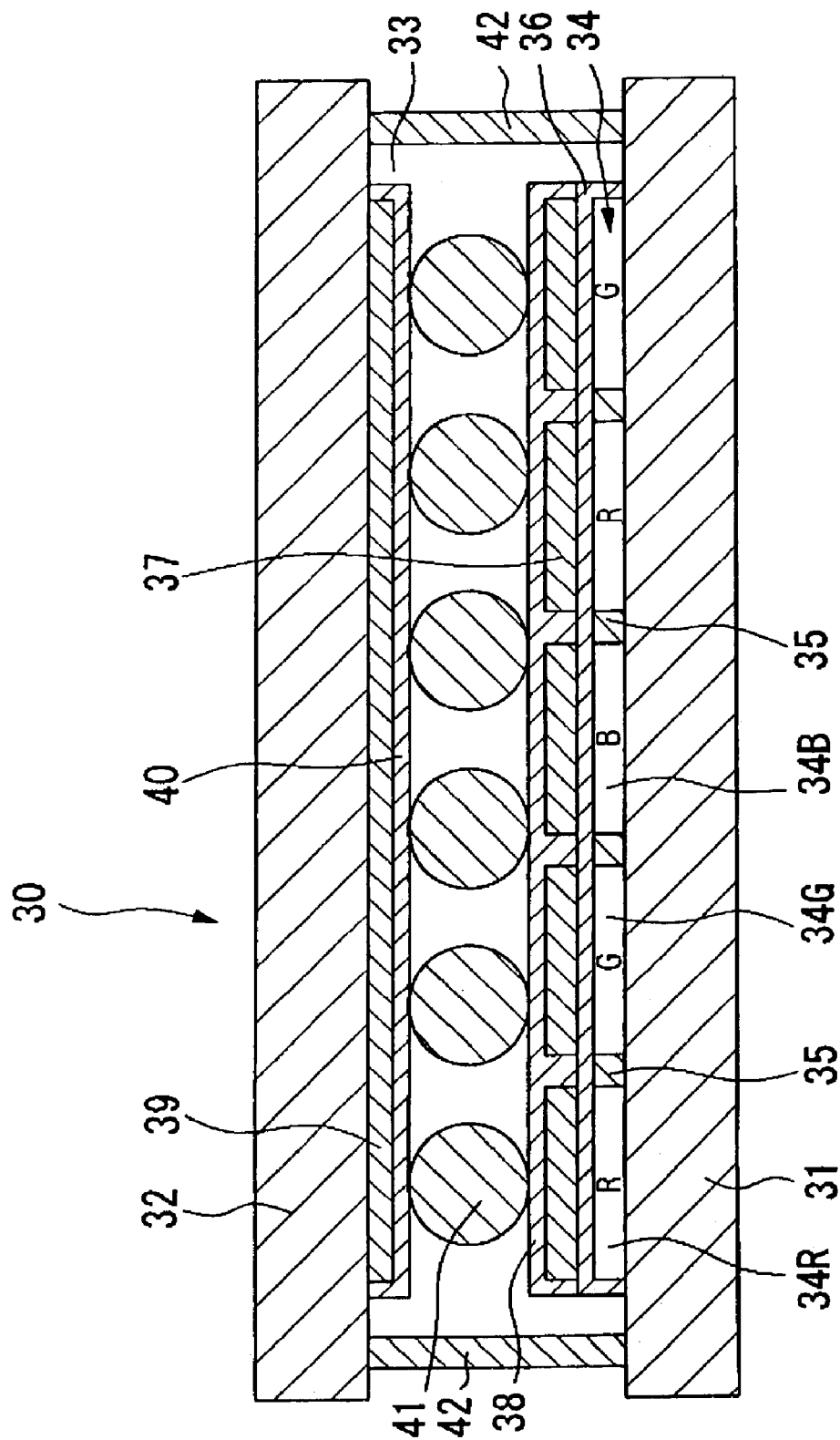
FIG. 4 is a side cross-sectional view for illustrating the schematic structure of one example of a liquid crystal display formed in accordance with the present invention.

FIG. 4 is a view showing a passive matrix liquid crystal display (liquid crystal display device), and reference numeral 30 in FIG. 4 indicates the liquid crystal display. This liquid crystal display 30 is a transmissive type in which a liquid crystal layer 33 composed of STN (super twisted nematic) liquid crystal or the like is held between a pair of glass substrates 31 and 32.

On the inside surface of the glass substrate 31, a color filter 34 is formed. The color filter 34 is composed of color layers 34R, 34G, and 34B having colors, red (R), green (G), and blue (B), respectively, which are regularly arranged. Between the color layers 34R (34G, 34B), delimiters 35 formed of a black matrix or banks are formed. In addition, on the color filter 34 and the delimiters 35, an overcoating film 36 is formed so as to eliminate steps formed by the color filter 34 and the delimiters 35 for planarization. As described later, this overcoating film 36 is formed by the thin-film forming device 1 of the present invention shown in FIG. 1.

On the overcoating film 36, a plurality of electrodes 37 is formed in a stripe pattern, and on the surface thereof, an alignment film 38 is formed.

On the inside surface of the other glass substrate 32, a plurality of electrodes 39 is formed in a stripe pattern so as to orthogonally intersect the electrodes at the color filter 34 side, and on the electrodes 39, an alignment film 40 is formed. The color layers, 34R, 34G, and 34B of the color filter 34 are disposed at positions corresponding to those at which the electrodes 39 of the glass substrate 32 and the electrodes 37 of the glass substrate 31 intersect each other. In addition, the electrodes 37 and 39 are each formed of a transparent conductive material such as ITO (indium tin oxide). Furthermore, on each of the outer surfaces of the glass substrate 32 and the color filter 34, an alignment film (not shown) is provided, and between the glass substrates 31 and 32, spacers 41 are provided so as to maintain a constant spacing (cell gap) therebetween. In addition, the glass substrates 31 and 32 are tightly bonded to each other with a sealing material 42 provided therebetween to form a cell so that the liquid crystal layer 33 is isolated from the outside air.

In the liquid crystal display 30 having the structure described above, in particular, the overcoating film 36 is formed by the thin-film forming device 1 of the present invention shown in FIG. 1.

When the overcoating film 36 is formed, as the coating solution L for forming the overcoating film, for example, a solution is first prepared containing an acrylic resin as a primary film-forming material (solid component); a mixed solvent of diethyleneglycol dimethyl ether (DG) and butylcarbitol acetate (BCTAC), which dissolves or disperses the acrylic resin; an epoxy compound; and a coupling agent. In the mixed solvent described above, since BCTAC has a particularly high boiling point of 247° C., by properly setting the mixing ratio between the two types of solvents, a curing rate of the coating solution L which is ejected and applied can be adjusted.

In addition, since the coating is performed using the coating solution L described above, in the supply device 24 of the solvent vapor supply mechanism 5, diethyleneglycol dimethyl ether (DG), butylcarbitol acetate (BCTAC), or a mixture thereof is prepared so that the vapor generated therefrom is supplied inside the cover 23. The solvent vapor to be supplied is not limited to that of the solvent used for the coating solution L, and for example, a different type of solvent vapor having properties similar to that of the solvent for the coating solution L may be used. In other words, as described below, since the solvent vapor in this embodiment is used to adjust the degree of generation of the solvent vapor from the coating solution L to be formed into the overcoating film 36 on the glass substrate 31, a solvent different from that used for the coating solution L may be used as long as being capable of performing the adjustment described above. However, a solvent, which will not degrade the quality of a film to be formed, is only used.

Figure 8:
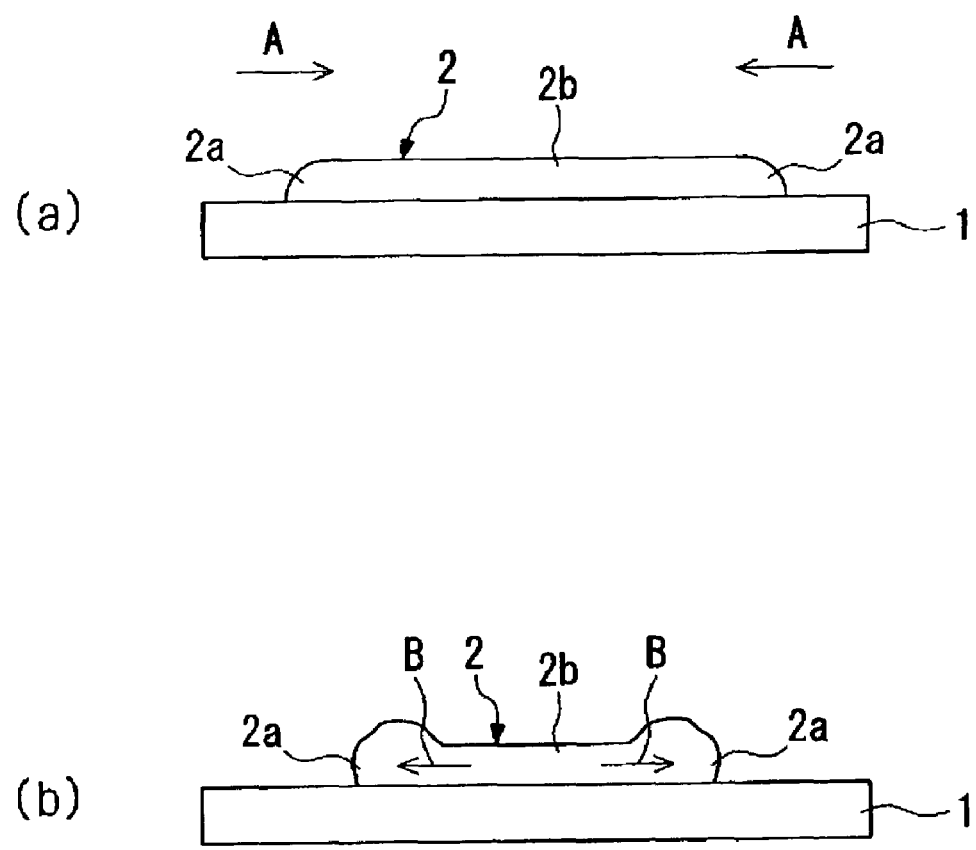
FIGS. 8(a) and (b) are side views each illustrating a problem of a conventional coating method.

In addition, it should be understood that the concentration of the solvent vapor to be supplied is not particularly limited, however, as described above with reference to FIGS. 8(*a*) and (*b*), the difference in concentration between over the central portion 2b of the film 2 and over the peripheral portion 2b is decreased so that the difference mentioned above can be substantially ignored. In particular, when a vapor at a sufficiently high concentration is supplied as compared to that of the solvent vapor generated from the film 2, the difference in concentration between over the central portion 2b and over the peripheral portion 2b described above can be ignored. Hence, degradation of the thickness uniformity over the entire film after curing, which is caused by the difference in concentration of the solvent vapor, can be avoided.

Next, the substrate SUB (glass substrate 31) provided with the color filter 34 and the delimiters 35, which is prepared beforehand, is placed at a predetermined position on the substrate stage 6 and is then tightly fixed thereon. In the state described above, ejection is performed from the droplet ejection head 2, thereby forming a film of the coating solution L on the color filter 34 and the delimiters 35, both of which are provided on the glass substrate 31. After the film of the coating solution L is formed, or prior to the formation of the film of the coating solution L, the cover 23 of the solvent vapor supply mechanism 5 is moved down so that the bottom end portion of the cover 23 is placed in the vicinity of the surface of the substrate stage 6, and in addition, the solvent vapor is generated by the supply device 24. Subsequently, the solvent vapor is supplied inside the double-wall of the cover 23 through the flexible pipe 25 and is then ejected from the supply openings 23c formed in the bottom end portion.

Accordingly, since the supply openings 23c formed in the bottom end portion of the cover 23 are located in the vicinity of the surface of the substrate stage 6, the solvent vapor thus ejected is supplied to the vicinity of the surface at the peripheral portion side of the substrate SUB covered with the cover 23, that is, the solvent vapor is supplied to the vicinity of the peripheral portion of the coating solution L applied onto the substrate SUB. As a result, in the vicinity of this substrate SUB, the concentration of the solvent vapor thus supplied is high at the peripheral portion of the coating solution L on the substrate SUB as compared to that at the central portion.

When the solvent vapor is supplied as described above, in the vicinity of the surface of the coating solution L provided on the substrate SUB, the difference in concentration of the solvent vapor between over the central portion and over the peripheral portion is decreased, and in addition, the concentration of the solvent vapor supplied from the supply openings 23c is high at the peripheral portion of the coating solution L provided on the substrate SUB as compared to that at the central portion. Hence, the difference in concentration of the solvent vapor described above is more significantly decreased. As a result, the convection of the solvent, which occurs in the film of the coating solution L by the difference in concentration of the solvent vapor, can be avoided, and hence the variation in film thickness after curing, which is caused by the convention described above, can also be avoided.

Accordingly, by the solvent vapor supply using the solvent vapor supply mechanism 5 described above, the film thickness of the overcoating film 36 obtained after curing becomes sufficiently uniform, and hence satisfactory flatness can be given to the surface of the alignment film 38 formed on the overcoating film 36.

The solvent vapor thus supplied and that generated from the coating solution L are returned again to the supply device 24 through the suction fan 26 and the flexible pipe 27.

In addition, in a method for applying the coating solution L for forming the overcoating film 36, in order to control the overcoating film 36 so as to have a desired film thickness after curing, at least one of the ejection operation by the ejection mechanism 3 and the moving operation by the moving mechanism 4 is controlled by the control unit C of the thin-film forming device 1. In particular, at least one of film thickness controls by the following operations is performed.

Film thickness control by ejection spatial intervals is performed by the control unit C is to control the film thickness of the overcoating film 36 by changing the ejection spatial intervals of the coating solution L applied onto the substrate SUB as the coating conditions. That is, when the ejection spatial intervals are decreased, the coating amount per unit area on the surface of the substrate SUB is increased, thereby forming a thick film, and on the other hand, when the ejection spatial intervals are increased, the coating amount per unit area is decreased, thereby forming a thin film.

In more particular, by changing the relative moving speed between the droplet ejection head 2 and the substrate SUB, the ejection spatial intervals are changed. In other words, when the moving speed is increased, the coating amount per unit moving length is decreased, thereby decreasing the film thickness, and on the other hand, when the moving speed is decreased, the coating amount per unit moving length is increased, thereby increasing the film thickness. For example, when coating is performed by moving the stage 10a or 10b using the moving mechanism 4 in the X axis direction or the Y axis direction with respect to the droplet ejection head 2 so that the substrate SUB is moved in the X axis direction or the Y axis direction with respect to the droplet ejection head 2, the film thickness can be decreased by increasing the moving speed in the X axis direction or the Y axis direction while the ejection time intervals are maintained constant.

In addition, the ejection spatial intervals may be changed by changing the ejection time intervals when the droplet ejection head 2 and the substrate SUB are relatively moved. In other words, when the ejection time intervals are decreased, the coating amount per unit moving length is increased, thereby increasing the film thickness, and on the other hand, when the ejection time intervals are increased, the coating amount per unit moving length is decreased, thereby decreasing the film thickness. For example, when the ejection time intervals for ejecting the coating solution L by the ejection mechanism 3 are decreased while the moving speed of the droplet ejection head 2 by the moving mechanism 4 is maintained constant, the film thickness can be increased.

Furthermore, the ejection spatial intervals may be changed by optionally assigning some nozzles 18 among said plurality of nozzles 18 to simultaneously eject the coating solution L. When the number of the nozzles 18 performing simultaneous ejection is larger, and the distances between the nozzles 18 described above are smaller, the coating amount per unit area becomes larger, thereby increasing the film thickness. On the other hand, when the number of the nozzles 18 performing simultaneous ejection is smaller, and the distances between the nozzles 18 described above are larger, the coating amount per unit area becomes smaller, thereby decreasing the film thickness. That is, for example, when every other nozzle 18 among those which are aligned at regular intervals is assigned to eject the coating solution L, the ejection spatial intervals become two times that obtained in the case in which all the nozzles 18 eject the coating solution L, and hence the film thickness can be decreased to one half of that obtained in the case described above. In this embodiment, for example, the ejection spatial intervals are controlled in the range of from 1 to 100 μm.

Film thickness control by ejection amount is performed by the control unit C is to control the film thickness by changing the ejection amount of the coating solution L per dot as the coating conditions. That is, since the coating amount per unit area is changed in proportion to the ejection amount, the film thickness can be increased when the ejection amount is increased, and on the other hand, when the ejection amount is decreased, the film thickness can be decreased. For example, when a drive voltage applied to the piezoelectric element 20 of the droplet ejection head 2 is changed in the range of from 0.1 to 34.9 V by the ejection mechanism 3, and an appropriate drive waveform is selected, the ejection amount per dot can be changed from approximately 2 to 20 picoliters, and hence the film thickness can be controlled with high accuracy.

In addition, the ejection amount from each nozzle 18 may be changed by the control unit C so as to control the film thickness. That is, the coating amount can be optionally changed by the ejection mechanism 3 in accordance with the position and the ejection amount of each nozzle 18, and hence various control of the film thickness can be performed. For example, when each other nozzle 18 among those which are aligned at regular intervals is assigned to eject a decreased amount per dot, compared to the case in which all the nozzles 18 eject the same amount, the coating amount is decreased, and hence the film thickness can be decreased.

Figure 5:
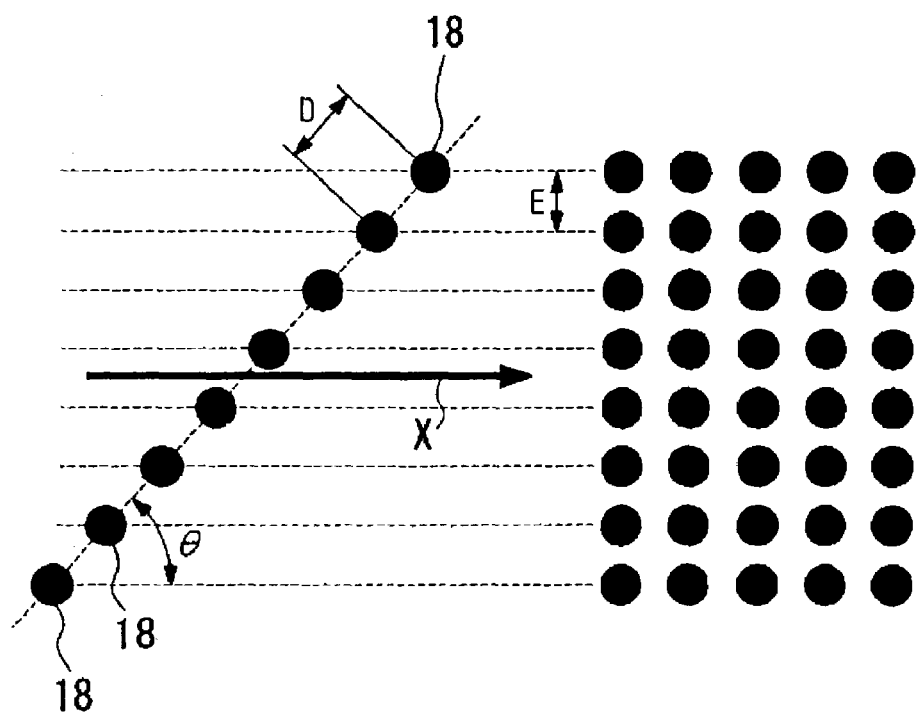
FIG. 5 is a view for illustrating nozzle pitches when an angle of the droplet ejection head is changed.

Film thickness control by angle of nozzle alignment direction can be performed by the control unit C is to control the film thickness by changing the angle formed by the alignment direction of the nozzles and the moving direction by the moving mechanism as the coating conditions. That is, for example, when the angle $\theta$ formed by the alignment direction of the nozzles 18 and the moving direction (for example, the X axis direction) is decreased by rotating the droplet ejection head 2 using the head supporter 7 as shown in FIG. 5, an apparent nozzle pitch E can be decreased as compared to an actual nozzle pitch D, and hence the coating amount per unit moving length can be increased, thereby increasing the film thickness.

In film thickness control by repeated coating, when a coating is repeatedly performed at the same position on the substrate SUB, the coating conditions for each coating is selected from at least one of the film thickness controls described above by the control unit C. That is, for example, the coating conditions performed for first coating can be changed for subsequent coating in consideration of characteristics such as a drying characteristic (volatility) of the coating solution L, and hence coating can be repeatedly performed under appropriate conditions in consideration of the state of the coating solution L.

Film thickness control by regions can be performed by the control unit C, since coating is performed for each of a plurality of regions on the surface of the substrate SUB under the coating conditions using at least one of the film thickness controls described above, the film thickness can be optionally set in each region, and in addition, by finely adjusting the coating amount for each region in consideration of characteristics such as a drying characteristic (volatility) of the coating solution L in said each region, the thickness uniformity can be obtained with higher accuracy.

In addition, it should be understood that the thin-film forming device 1 of the present invention is not limited to that described in the embodiment, and that it may be modified without departing from the spirit and the scope of the present invention.

Figure 6:
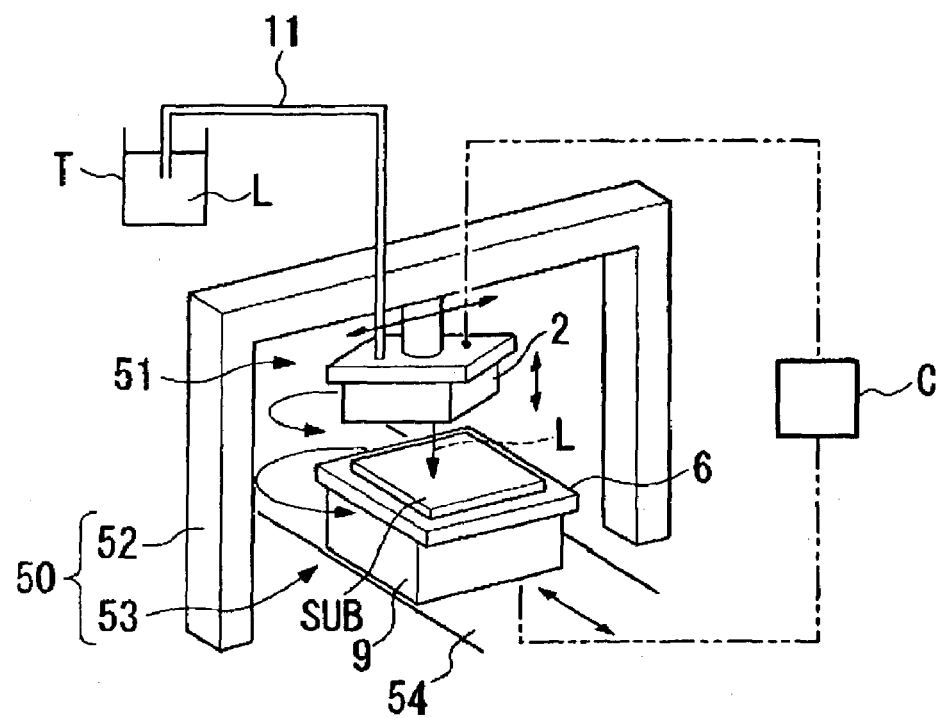
FIG. 6 is a perspective view for illustrating an important portion of the schematic structure of another example of a thin-film forming device of the present invention.

For example, as the moving mechanism, instead of the moving mechanism 4, the structure as shown in FIG. 6 may also be used. The points of a moving mechanism 50 shown in FIG. 6 different from those of the moving mechanism 4 are that an ejection mechanism 51 has an X axis stage 52 capable of moving the droplet ejection head 2 in the X axis direction, and a stage drive portion 53 has a stage 54 which can be moved in the Y axis direction and can be positioned at a desired place but do not have a stage which can be moved in the X axis direction and can be positioned at a desired place.

Even in the thin-film forming device having the moving mechanism 50 as described above, movement of the droplet ejection head 2 and the substrate SUB on the substrate stage 6 in the horizontal plane (X axis direction and Y axis direction) for the relative movement and positioning can be controlled by the moving mechanism 50. Accordingly, the film thickness control performed by the control unit C described above can be reliably performed by this moving mechanism 50.

In addition, in the embodiment described above, the thin-film formation by the thin-film forming device of the present invention is applied to the formation of the overcoating film 36 used for a liquid crystal display. However, it should be understood that the present invention is not limited thereto and may be applied to the formation of various thin films. For example, in the liquid crystal display 30 described above, the present invention may be applied to the formation of the alignment film 40. In addition, the present invention may be applied to application of an etching resist, which is necessary for a process for forming a printed circuit substrate or a drive circuit provided thereon of a liquid crystal display.

Furthermore, in addition to the liquid crystal displays, the present invention may be applied to the formation of thin films used for various thin-film structures. In particular, in an optical-disc thin-film structure provided with a protection film on the surface thereof, the thin-film forming device of the present invention may be used for forming the protection film, and in the case described above, a protection film having superior thickness uniformity over the entire optical disc substrate can be easily formed.

In addition, it should be understood that the solvent vapor supply mechanism 5 is not limited to the structure shown in FIG. 1. For example, a single wall may be used as the cover instead of the double-wall structure, and openings may be provided at optional positions of the flexible pipe as the supply openings. By the structure described above, the difference in concentration of the solvent vapor in the vicinity of the surface of the substrate can be decreased, and the thickness uniformity can be improved by preventing the variation in thickness caused by the difference described above.

Next, particular examples of electronic apparatuses will be described each provided with display means formed of the liquid crystal display of the above embodiment.

Figure 7:
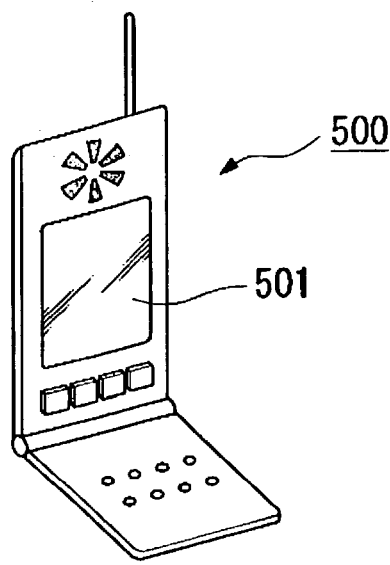
FIGS. 7a-7c includes views showing particular examples of electronic apparatuses each provided with displaying means, 7(a) is a perspective view showing an example in which the displaying means is provided for a mobile phone, 7(b) is a perspective view showing an example in which the displaying means is provided for an information processing device, and 7(c) is a perspective view showing an example in which the displaying means is provided for a wristwatch-shaped electronic apparatus.
Figure 7:
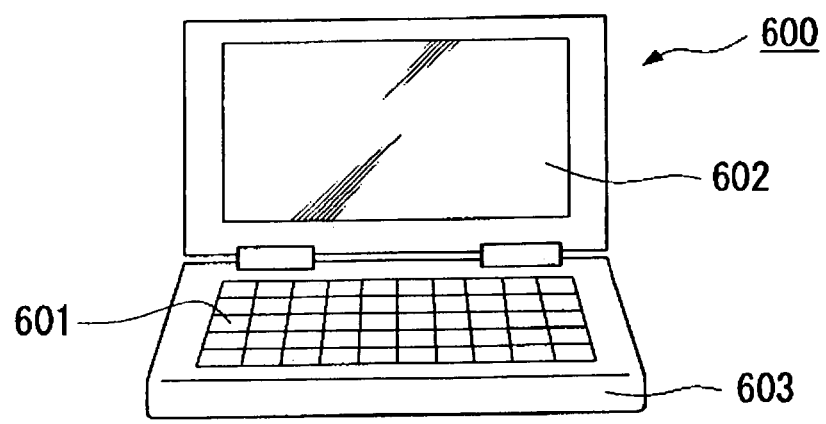
Figure 7:
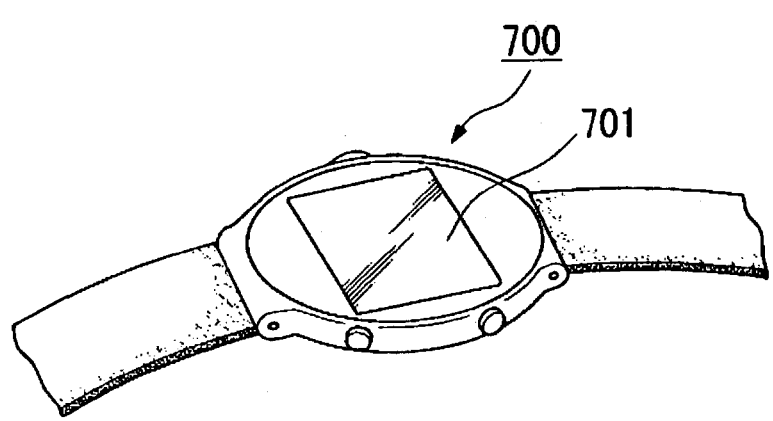

FIG. 7(a) is a perspective view showing an example of a mobile phone. In FIG. 7(a), reference numeral 500 indicates a mobile phone body, and reference numeral 501 indicates a display portion (display means) formed of the liquid crystal display shown in FIG. 4.

FIG. 7(b) is a perspective view showing an example of a mobile information processing apparatus such as a word processor or a personal computer. In FIG. 7(b), reference numeral 600 indicates an information processing apparatus, reference numeral 601 indicates an input portion, such as a keyboard, reference numeral 603 indicates an information processing body, and reference numeral 602 indicates a display portion (display means) formed of the liquid crystal display shown in FIG. 4.

FIG. 7(c) is a perspective view showing an example of a wristwatch-shaped electronic apparatus. In FIG. 7(c), reference numeral 700 indicates a watch body, and reference numeral 701 indicates a display portion (display means) formed of the liquid crystal display shown in FIG. 4.

The electronic apparatuses shown in FIGS. 7(a) to (c) are each provided with a display portion (a display device) formed of the liquid crystal display described above, and hence superior display quality can be obtained.

As described above, according to the thin-film forming device of the present invention, by supplying the solvent vapor using the solvent vapor supply mechanism to the vicinity of the coating solution applied onto the substrate, the difference in concentration of the solvent vapor between over the central portion of the coating film and over the peripheral portion thereof can be decreased. Hence, the degradation of the thickness uniformity over the entire film, which is caused by the difference described above, can be avoided, thereby forming a thin film having a uniform thickness. In addition, by using the droplet ejection head, losses of materials can be reduced, and hence the cost can also be reduced.

According to the thin-film forming method of the present invention, by supplying the solvent vapor using the solvent vapor supply mechanism of the thin-film forming device to the vicinity of the coating solution applied onto the substrate, the degradation of the thickness uniformity of the thin film can be avoided. Accordingly, a thin film having a uniform thickness can be formed, and as a result, the cost can also be reduced.

According to the device and the method of the present invention for manufacturing the liquid crystal display, the thickness of a thin film to be formed can be made uniform by supplying the solvent vapor to the vicinity of the coating solution applied onto the substrate using the solvent supply mechanism of the thin-film forming device, and hence problems such as alignment irregularity of liquid crystal or color irregularity can be avoided.

According to the liquid crystal display of the present invention, since the thickness of a thin film to be formed is uniform, for example, problems such as alignment irregularity of liquid crystal or color irregularity can be avoided.

According to the device and the method of the present invention for manufacturing the thin-film structure, the thickness of a thin film to be formed can be made uniform by supplying the solvent vapor to the vicinity of the coating solution applied onto the substrate using the solvent supply mechanism of the thin-film forming device.

According to the thin-film structure of the present invention, the thickness of a thin-film to be formed can be made uniform.

Since the electronic apparatus of the present invention is provided with the liquid crystal display or the thin-film structure described above as display means, superior display can be performed by using the liquid crystal display as display means in which inconveniences such as alignment irregularity of liquid crystal or color irregularity can be avoided.

What is claimed is:

1. A thin-film forming device for forming a thin film, which applies a coating solution containing a film-forming material dissolved or dispersed in a solvent onto a substrate, the device comprising:

an ejection mechanism having a droplet ejection head that ejects the coating solution onto the substrate;

a moving mechanism capable of relatively moving positions of the droplet ejection head and the substrate;

a control unit that controls at least one of the ejection mechanism and the moving mechanism;

a solvent vapor supply mechanism that generates and supplies a solvent vapor to the vicinity of the coating solution applied onto a top surface of the substrate, the solvent vapor being supplied on the top surface of the substrate, the solvent vapor mechanism including:

a cover that covers at least the top surface of the substrate and having a double-wall structure, the cover including at least a top plate, a right plate, and a side plate, the top plate of the cover being directly above the droplet ejection head, each plate of the cover having a wall along a length that is longest, and the wall of each plate including an inner subwall and an outer subwall along the length, the cover being configured to move down toward the substrate so that an end portion of the cover is in the vicinity of the top surface of the substrate; and a supply device that supplies the solvent vapor through the wall of each plate, the vapor being provided between the inner subwall and the outer subwall of the wall of each plate along the length, and the solvent vapor passing through the wall of each plate along the length onto the top surface of the substrate.

2. The thin-film forming device according to claim 1, the solvent vapor supply mechanism supplying the solvent vapor so that a concentration thereof is high at a peripheral portion of the coating solution applied onto the substrate as compared to that at a central portion thereof.

3. The thin-film forming device according to claim 1, the control unit charging the coating conditions of the coating solution by controlling at least one of an ejection operation by the ejection mechanism and a moving operation by the moving mechanism so as to control a thickness of the thin film.

4. A device for manufacturing a liquid crystal display including a pair of substrates and liquid crystal held therebetween, the device comprising:

the thin-film forming device according to claim 1, the thin-film forming device forming at least one type of thin film on at least one substrate.

5. A device for manufacturing a thin-film structure in which a thin film is provided on a substrate, the device comprising:

the thin-film forming device according to claim 1,
the thin-film forming device forming at least one type of thin film on the substrate.

6. The thin-film forming device according to claim 1, the top plate being in between the right plate and the side plate of the cover, the wall of each plate being connected to each other.

* * * * *